US007884525B2

(12) United States Patent
Culpepper et al.

(10) Patent No.: US 7,884,525 B2
(45) Date of Patent: Feb. 8, 2011

(54) CARBON NANOTUBE BASED COMPLIANT MECHANISM

(75) Inventors: Martin L. Culpepper, Danvers, MA (US); Spencer P. Magleby, Provo, UT (US); Larry L. Howell, Orem, UT (US); Christopher M. DiBiasio, Cambridge, MA (US); Robert M. Panas, Westborough, MA (US)

(73) Assignees: Massachusetts Institute of Technology, Cambridge, MA (US); Brigham Young University, Provo, UT (US)

( * ) Notice: Subject to any disclaimer, the term of this patent is extended or adjusted under 35 U.S.C. 154(b) by 860 days.

(21) Appl. No.: 11/832,041

(22) Filed: Aug. 1, 2007

(65) Prior Publication Data

US 2008/0144304 A1 Jun. 19, 2008

Related U.S. Application Data

(60) Provisional application No. 60/835,467, filed on Aug. 3, 2006.

(51) Int. Cl.
*H02N 1/00* (2006.01)

(52) U.S. Cl. ...................... 310/309; 310/12.03; 310/15; 310/36; 977/724; 977/725; 361/820

(58) Field of Classification Search ............. 310/12.03, 310/15, 36, 309; 361/820; 977/724, 725; *H02N 1/00*
See application file for complete search history.

(56) References Cited

U.S. PATENT DOCUMENTS 6,559,550 B2 5/2003 Herman
6,709,566 B2 3/2004 Cumings et al.
6,756,795 B2 6/2004 Hunt
6,803,840 B2 * 10/2004 Hunt et al. .................. 333/186
7,053,520 B2 * 5/2006 Zetti et al. .................. 310/309
7,404,338 B2 * 7/2008 Hierold et al. ........... 73/862.68
7,453,183 B2 * 11/2008 Zettl et al. .................. 310/309
7,518,283 B2 * 4/2009 Pinkerton et al. ........... 310/309
7,636,101 B2 * 12/2009 Sprague et al. ............. 347/243
2002/0070426 A1 * 6/2002 Cumings et al. ............ 257/613
2004/0239210 A1 * 12/2004 Pinkerton et al. ........... 310/309
2005/0017598 A1 * 1/2005 Zettl et al. .................. 310/309
2006/0057383 A1 * 3/2006 Cumings et al. ............ 428/403
2007/0085444 A1 * 4/2007 Pinkerton et al. ........... 310/309

(Continued)

OTHER PUBLICATIONS

Dong et al., Towards Nanotube Linear Servomotors, IEEE Transactions on Automation Science and Engineering, vol. 3, No. 3, Jul. 2006 pp. 228-235.

(Continued)

*Primary Examiner*—Quyen Leung
*Assistant Examiner*—John K Kim
(74) *Attorney, Agent, or Firm*—Sampson & Associates, P.C.

(57) ABSTRACT

A nano-scale compliant mechanism includes a coupler and a plurality of nanotubes disposed for nano-scale motion relative to a grounded component. The nanotubes are fastened at one end to the coupler and at the other end to ground, to guide motion of the coupler relative to the ground. Particular embodiments include a plurality of parallel carbon nanotubes. An exemplary embodiment exhibits first and second regions of mechanical behavior; a first region governed by bulk elastic deformation of the nanotubes and a second region governed by compliant, hinge-like bending of the buckled nanotubes.

28 Claims, 14 Drawing Sheets

400
420
FA
FB
CNTs
410
410
y
x
430

U.S. PATENT DOCUMENTS

| | | | | |
|---|---|---|---|---|
| 2007/0114880 | A1 * | 5/2007 | Zettl et al. | 310/309 |
| 2008/0144304 | A1 * | 6/2008 | Culpepper et al. | 361/820 |
| 2008/0238244 | A1 * | 10/2008 | Chaillout et al. | 310/308 |

OTHER PUBLICATIONS

Lin et al., Carbon Nanotube Machine Elements: Components of Small-scale, Compliant Mechanisms and Positioning Equipment, MTL Annual Research Report, 2005 p. 243.
Tang, W.C., T.C. H. Nguyen, and R.T. Howe, "Laterally Driven Polysilicon Resonanat Microstructures", Sensors and Actuators, 20 , 1989, pp. 25-32.
Lu, Jia, Liang Zhang, "Analysis of localized failure of single-wall carbon nanotubes", Computational Materials Science 35, 2006, pp. 432-441.
Bourlon, Bertrand, D. Christian Glattli, Csilla Miko, Laszlo Forro, and Adrian Bachtold, "Carbon Nanotube Based Bearing for rotational Motions", 2004 American Chemical Society, Nano Letter,s 2004 vol. 4, No. 4, pp. 709-712.
Zhang, Sulin, Wing Kim Liu, and Rodney S. Ruoff, "Atomistic Simulations of Double-Walled Carbon Nanotubes (DWCNTs) as Rotational Bearings", 2004 American Chemical Society, Nano Letters, 2004 vol. 4, No. 2, pp. 293-297.
Fennimore, A.M., T.D. Yuzvinsky, Wel-Qiang Han, M.S. Fuhrer, J. Cumings and A. Zettl, "Rotational actuators based on carbon nanotubes", 2003 Nature Publishing Group, Nature vol. 424, 2003, pp. 408-410.
Meyer, Jannik C., Matthieu Paillet, Siegmar Roth, "Single-Molecule Torsional Pendulum", Science vol. 309, Sep. 2, 2005, pp. 1539-1541.
Papadakis, S. J., A.R. Hall, P.A. Williams, L. Vicci, M.R.Falvo, R. Superfine, and S. Washburn, Resonant Oscillators with Carbon-Nanotube Torsion Springs; The American Physical Society, 2004, vol. 93, No. 14, pp. 146101-1-146101-4.
Cumings, John, et al., "Low-Friction Nanoscale Linear Bearing Realized from Multiwall Carbon Nanotubes", Science 289, 2000, pp. 602-604.
Yu, Min-Feng, Boris I. Yakobson, and Rodney S. Ruoff, Controlled Sliding and Pullout of Nested Shells in Individual Multiwalled Carbon Nanotubes, American Chemical Society, J. Phys, Chem. B, vol. 104, No. 37, 2000, pp. 8764-8767.
Saito, R., R. Matsuo, T. Kimura, G. Dresselhaus, M.S. Dresselhaus, "Anomalous potential barrier of double-wall carbon nanotube", 2001 Elsevier Science B.V., Chemical Physics Letters 348, pp. 187-193.
Lozovik, Yu. E., A. V. Minogin, A. M. Popov, "Nanomachines based on carbon nanotubes", Elsevier Science B.V., Physics Letters A 313, 2003, pp. 112-121.
Belikov, A. V., Yu E. Lozovik, A. G. Nikolaev, and A. M. Popov, Double-wall nanotubes: classification and barriers to walls relative rotation, sliding and screwlike motion, Elsevier B.V., Chemical Physics Letters 385, 2004, pp. 72-78.
Brazier, L.G., "On the Flexure of Thin Cylindrical Shells and Other "Thin" Sections", JSTOR Proceedings of the Royal Society of London. Series A,vol. 116, No. 773, Sep. 1, 1927, pp. 104-114.
Chang, Tienchong, Juan Hou, Xingming Guo, "Reversible mechanical bistability of single-walled carbon nanotubes under axial strain"American Institute of Physics, 2006, Applied Physics Letters 88, pp. 211906-1-211906-3.
Pantano, Antonio, David M. Parks, and Mary C. Boyce, "Mechanics of deformation of single- and multi-wall carbon nanotubes", Elsevier 2003, Journal of the Mechanics and Physics of Solids 52, (2004), pp. 789-821.
Maiti, Amitesh, "Mechanical deformation in carbon nanotubes—bent tubes vs tubes pushed by atomically sharp tips", 2000 Elsevier Science B.V. Chemical Physics Letters 331 (2000) pp. 21-25.
Ebbesen, T.W. and T. Takada, "Topological and SP3 Defect Structures in Nanotubes", Pergamon, 1995. Carbon, vol. 33, No. 7, pp. 973-978.
Huhtala, M., A.V. Krasheninnikov, J. Aittoniemi, S.J. Stuart, K. Nordlund, and K. Kashi, "Improved mechanical load transfer between shells of multiwalled carbon nanotubes". The American Physical Society, 2004, Physical Review B 70, 045404 (2004), pp. 045404-1-045404-8.
Xia, Yueyuan, Mingwen Zhao, Yuchen Ma, Minju Ying, Xiangdong Liu, Pijun Liu, and Liangmo Mei, "Tensile strength of Single-walled carbon nanotubes with defects under hydrostatic pressure", 2002 The American Physical Society, Physical Review B, vol. 65, 155415, pp. 155415-1-155415-7.
Dumitrica, Traian, Ted Belytscko and Boris I. Yakobson,"Bond-breaking bifurcation states in carbon nanotube fracture", Journal of Chemical Physics, vol. 118, No. 21, 2003 American Institute of Physics, pp. 9485-9488.
Lu, Qiang, Baidurya Bhattacharya, "The role of atomistic simulations in probing the small-scale aspects of fracture—a case study on a single-walled carbon nanotube", 2005 Elsevier Ltd., Engineering Fracture Mechanics 72 (2005) pp. 2037-2071.
DiBiasio, Christopher M., Michael A. Cullinan, and Martin L. Culpepper, "Difference between bending and stretching moduli of single-walled carbon nanotubes that are modeled as an elastic tube", 2007 American Institute of Physics, Applied Physics Letters 90, 203116 (2007) pp. 203116-1-203116-3.

* cited by examiner

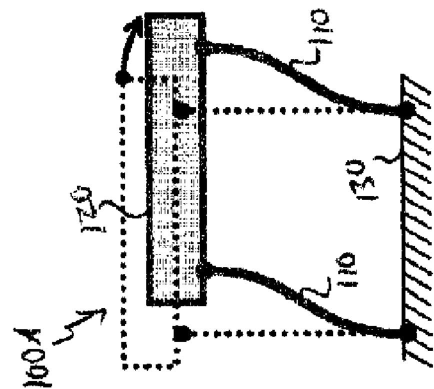
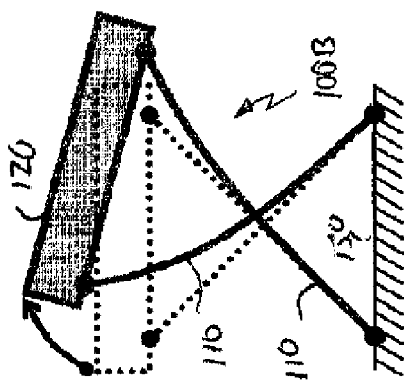
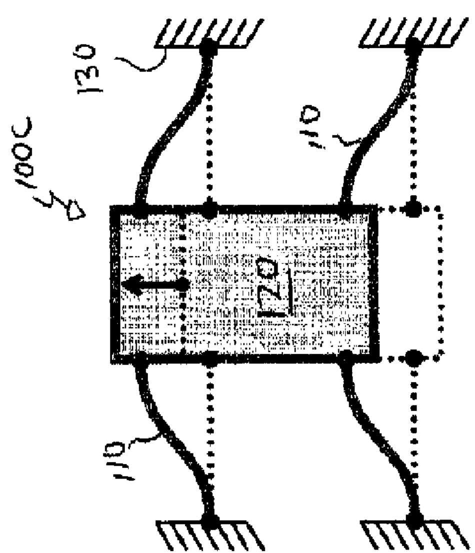
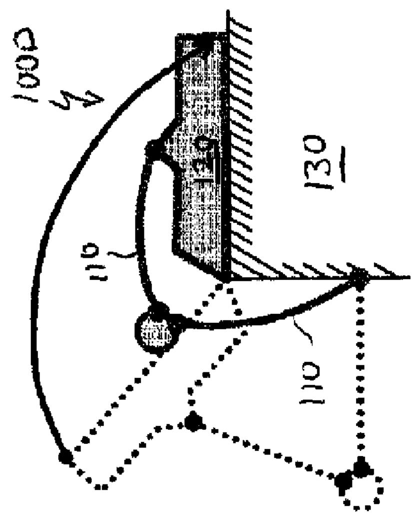

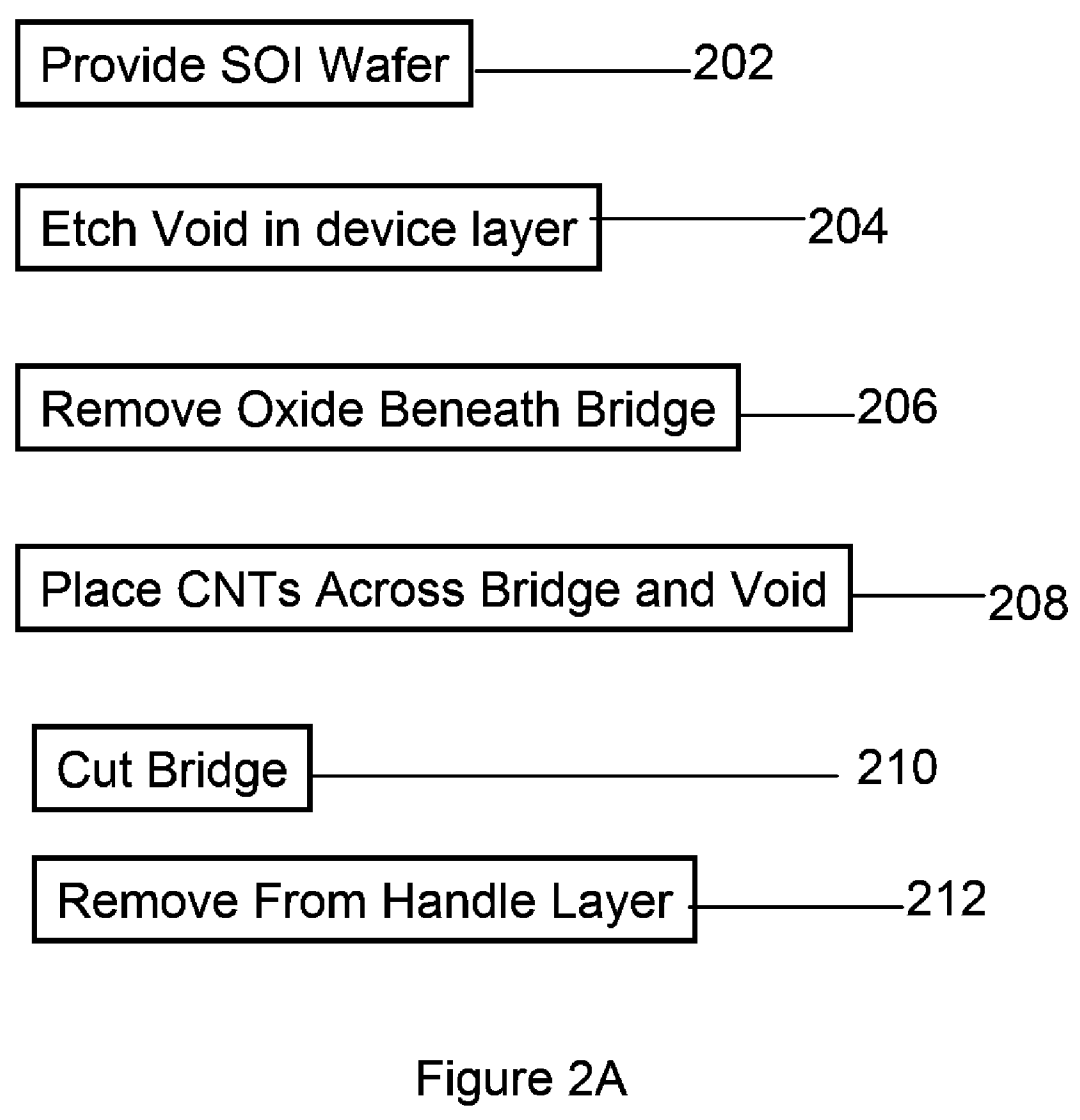

Provide SOI Wafer — 202

Etch Void in device layer — 204

Remove Oxide Beneath Bridge — 206

Place CNTs Across Bridge and Void — 208

Cut Bridge — 210

Remove From Handle Layer — 212

Figure 2A

CARBON NANOTUBE BASED COMPLIANT MECHANISM

RELATED APPLICATIONS

This application claims the benefit of U.S. Provisional Application Ser. No. 60/835,467 entitled Guided-end Condition Method Used to Create Carbon Nanotube-Based Mechanisms, filed Aug. 3, 2006.

FIELD OF THE INVENTION

The present invention relates generally to nano-scale compliant mechanisms. More specifically, this invention relates to a nano-scale compliant mechanism including at least one compliant nanotube.

BACKGROUND OF THE INVENTION

Compliant mechanisms, such as parallel-guiding mechanisms (PGMs) are well known building blocks of micro- and macro-scale mechanical systems. The use of compliant PGMs in precision and high-cycle mechanical systems predates 1989 for micro-scale devices and 1937 for macro-scale devices. A typical prior art PGM includes at least first and second compliant parts deployed between a grounded component and a rigid coupler. The compliant components are typically disposed so as to deform elastically and guide the rigid coupler through an arcuate path. This motion may be repeated through many cycles if the stress within the compliant parts does not exceed a critical failure stress (e.g., a yield stress). Rigid link-hinge PGMs are also known in which substantially rigid components are joined to the grounded component and coupler at hinge-like joints.

Compliant mechanisms (CMs) are known in micro- and macro-scale mechanical devices having arcuate, linear, and/or rotary motion capabilities. In recent years, there has been significant interest in nano-scale mechanical systems. For example, there is a need to create nano-scale devices such as grippers for nano-manipulation, force-displacement transmissions for nano-scale transducers, and positioners for probing applications. The term nano-scale typically refers to devices having a size of less than 1 micron (e.g., 100s of nano-meters or less). The development of a nano-scale version of a compliant and/or rigid link-hinge PGM would greatly expand the type and variety of nano-mechanical devices that may be realized.

It will therefore be appreciated that there exists a need for nano-scale compliant mechanisms.

SUMMARY OF THE INVENTION

Embodiments of the present invention address the above described need for a nano-scale compliant mechanism. Aspects of these embodiments include a nano-scale compliant mechanism utilizing compliant nanotubes (e.g., carbon nanotubes). The inventive nano-scale compliant mechanism includes a coupler that is disposed for nano-scale motion relative to a grounded component. The nanotubes are coupled on one end to the grounded component and on another end to the coupler to guide motion of the coupler relative to the ground. In one embodiment, a nano-scale compliant mechanism in accordance with this invention includes a plurality of parallel carbon nanotubes, a first end of each being coupled to the grounded component and a second end of each being coupled to the coupler. One exemplary embodiment of the invention has been shown to exhibit first and second regions of mechanical behavior; a first region (relatively low strains) which tends to be governed by bulk elastic deformation (bending) of the nanotubes and a second region (higher strains) which tends to be governed by compliant, hinge-like bending of the buckled (kinked) nanotubes.

Exemplary embodiments of the present invention may provide several technical advantages. For example, embodiments provide for nano-scale (100s of nm and less) compliant mechanisms. Such compliant mechanisms may be combined (in parallel and/or in series) to form complex nano-mechanical systems. Compliance mechanisms in accordance with the invention may be fabricated from readily available nano-scale building blocks (e.g., carbon nanotubes which are commercially available in milligram quantities). Exemplary embodiments utilizing carbon nanotubes may also be capable of operating at relatively high levels of elastic strain (e.g., greater than 40% bending strain).

The features and advantages described herein are not all-inclusive and, in particular, many additional features and advantages will be apparent to one of ordinary skill in the art in view of the drawings, specification, and claims. Moreover, is should be noted that the language used in the specification has been principally selected for readability and instructional purposes, and not to limit the scope of the inventive subject matter.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A through 1D are schematic representations of exemplary nano-scale compliant mechanisms in accordance with the present invention.

FIG. 2A is a flow chart of an exemplary method for fabricating the nano-scale compliant mechanisms of FIGS. 1A through 1D.

DETAILED DESCRIPTION

General Overview

Figure 2B:
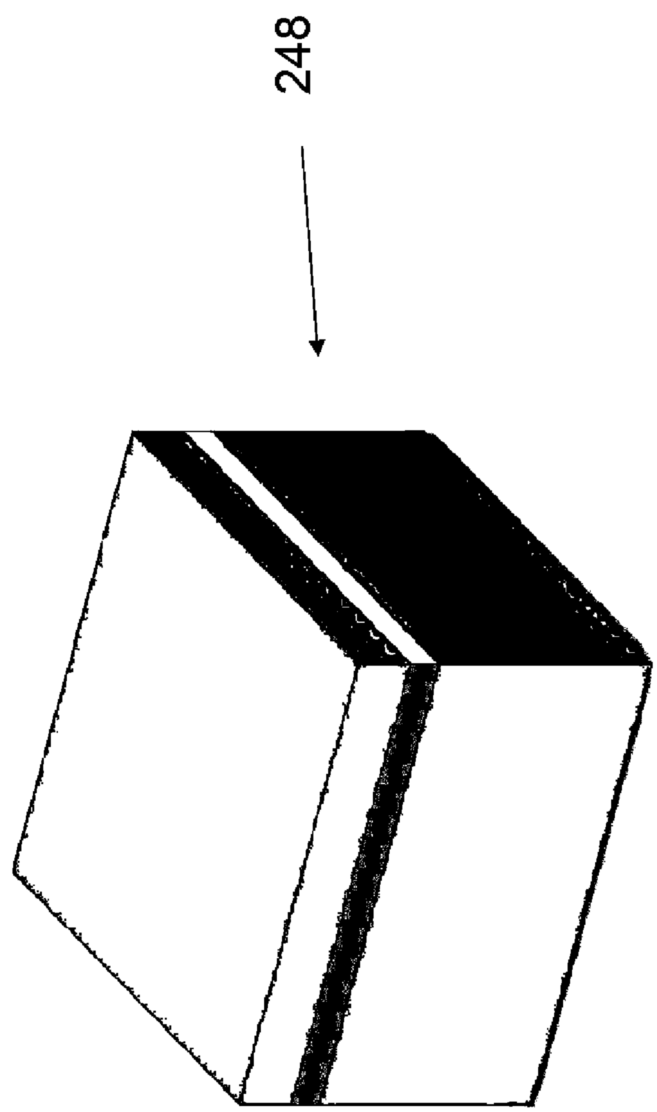
FIGS. 2B-2F are a series of perspective views of the method of FIG. 2A.

Embodiments of the invention are directed towards nano-scale machine elements that can be combined with similar elements or other machine elements to create complex nano-mechanical devices. These machines are configured by grounding a proximal end of the nanotube and constraining a distal end thereof to move with a guided end condition. These machine elements take advantage of the various unique properties of nanotubes (e.g., carbon nanotubes) to provide nano-scale compliant mechanisms that combine the behavior of both rigid link and compliant PGMs in a single machine. Moreover, as will be shown, when mimicking the movement of macro-scale rigid link-hinge PGMs, these embodiments are capable of operating without the drawbacks of significant friction and wear typically associated with conventional rigid mechanisms and devices. These embodiments thus provide devices capable of various constrained movements along a well-defined path (e.g., including arcuate, linear, and rotary motion), while resisting motion in other directions. The ability to provide such well-defined motion (while resisting motion in other directions) has not been heretofore available on the nano scale, and may be advantageously used in complex nano-mechanical devices.

Turning now to the figures, embodiments of the present invention will be described in greater detail. FIGS. 1A-1D depict four exemplary embodiments of nano-compliant mechanisms 100A, 100B, 100C, and 100D (referred to collectively herein as nanoCMs 100A-100D) in accordance with the present invention. NanoCMs 100A-100D are similar in that each includes at least one (and more commonly a plurality of) carbon nanotubes 110. A first end 112 of the nanotube 110 is grounded to a substantially immovable (in the reference frame of the device) structural ground component 130. A second end 114 of the nanotube 110 is attached to a mechanical coupler 120, which is disposed to move relative to the ground 130. It will be appreciated that the second ends 114 of the nanotubes are constrained by coupler 120 and by the unique structural properties of the nanotubes 110, to move with a guided end condition.

FIG. 1A depicts a nano-scale parallel four-bar compliant mechanism 100A, also commonly referred to as a compliant parallel-guiding mechanism. In this four-bar CM, the guided end condition constrains the second end 114 of each nanotube to substantially arcuate motion. At relatively small coupler displacements, motion of the coupler 120 is substantially linear in a direction parallel to the long axis of the coupler. Such motion is unique in the design of mechanical devices, because it permits a degree of control in obtaining approximately linear, or substantially arcuate, motion without undesired rotations or off-axis translations. In the exemplary embodiment of FIG. 1A, a plurality of carbon nanotube elements 110 may be deployed in parallel, via a mechanical interface with coupler 120, to create CM 100A. The invention is not limited to embodiments having two nanotube elements as of FIG. 1A. Rather, any number of nanotubes may be used.

FIG. 1B depicts an embodiment in the form of a nano-scale flexure pivot 100B in which first and second nanotubes 110 cross between the grounded surface 130 and the coupler 120. This flexure pivot provides for rotary motion of the coupler 120 as shown, which may be utilized, for example, in a nano-scale torque angle transducer. FIG. 1C depicts a nano-scale linear shuttle 100C in accordance with the present invention in which the coupler 120 is deployed between first and second grounded surfaces 130. Linear shuttle 100C provides for linear motion of the coupler 120 and may be utilized, for example in nano-force position transducers and other components for achieving substantially linear positioning on a nanometer length scale. It will be understood that in at least embodiments 100B and 100C, that in addition to their bending strain, nanotubes 110 will also be subject to axial elongation and contraction during movement of coupler 120. FIG. 1D depicts a nano-scale bi-stable four bar in accordance with the present invention in which a coupler 120 is disposed to snap between a closed position as shown, and an open position as shown in phantom. Such nano-elements may be advantageously used in valves, relays, non-volatile memory, and the like.

The above described exemplary embodiments have in common, among other things, the use of compliant nanotubes, such as carbon nanotubes. While the invention is explicitly not limited to the use of carbon nanotubes, they are used in many embodiments since they are commercially available and tend to exhibit favorable mechanical properties, such as the ability to accommodate bending strains in excess of 40%. Carbon nanotubes (CNTs) are well known allotropes of carbon. Single walled carbon nanotubes (SWCNT) are generally the most commonly studied form of CNT and typically include a single sheet of graphite (referred to as graphene) rolled into a seamless cylinder. SWCNTs typically have a diameter on the order of 1 nm (or less), although the invention is not limited in this regard. SWCNTs are known in the art to have interesting thermal, mechanical, electrical, and chemical properties. Double-walled and multi-walled CNTs are also known in the art. Multi-walled CNTs (MWCNT) are known to exist in at least two configurations; (i) nested, and (ii) parchment configurations. In the nested configuration, one or more SWCNTs is nested inside another larger diameter SWCNT. For example, in one exemplary embodiment of a double-walled CNT a (0,8) CNT is nested inside a (0,10) CNT. In the parchment configuration a single sheet of graphene is rolled around itself resembling a scroll of parchment. It will be understood that the present invention is not limited to utilizing any particular SWCNT or MWCNT configuration.

Carbon nanotubes may be used to create several nano-mechanical devices. For example, they may be used to create rotary sliding motion devices and nano-scale end effectors that rely on small-motion bending deformations. Devices that use CNTs to generate rotary motions via torsional compliance of the CNT may also be demonstrated. Telescoping sliding motions may be observed in some devices and studied via simulation. Helical sliding motions, i.e., bolt-nut type motions, may be simulated. NanoCMs in accordance with the present invention are distinguished from the above devices in their ability to guide motion of the coupler 120 along a well-defined path (e.g., including arcuate, linear, and rotary motion), while resisting motion in other directions. The ability to provide such well-defined motion (while resisting motion in other directions) may enable the fabrication of a wide range of complex nano-mechanical devices.

With reference now to the flowchart of FIG. 2A and to FIGS. 2B-2F, compliant mechanisms in accordance with the present invention (e.g., nanoCMs 100A, 100B, 100C, and 100D) may be fabricated by combining known techniques for manipulating CNTs with silicon micro- and nano-fabrication technology and a precision manipulation system operating within a scanning electron microscope (SEM).

As shown in FIG. 2B, this exemplary method embodiment begins with providing 202 a conventional SOI wafer 248 including two silicon layers (a device layer and a handle layer) separated by an oxide layer as shown. Wafer 248 may be fabricated using known micro- and nano-fabrication techniques including optical, electron beam (e-beam), focused ion beam (FIB), and chemical vapor deposition (CVD), etc.

Figure 2D:
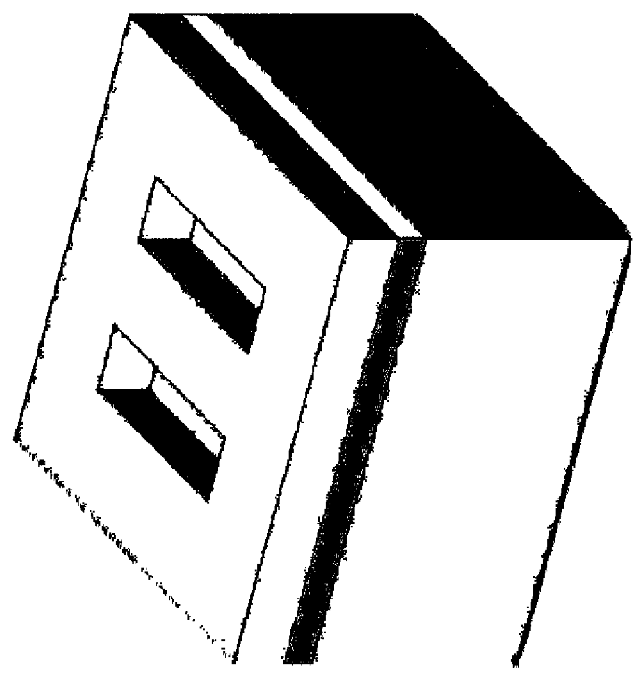
Figure 2C:
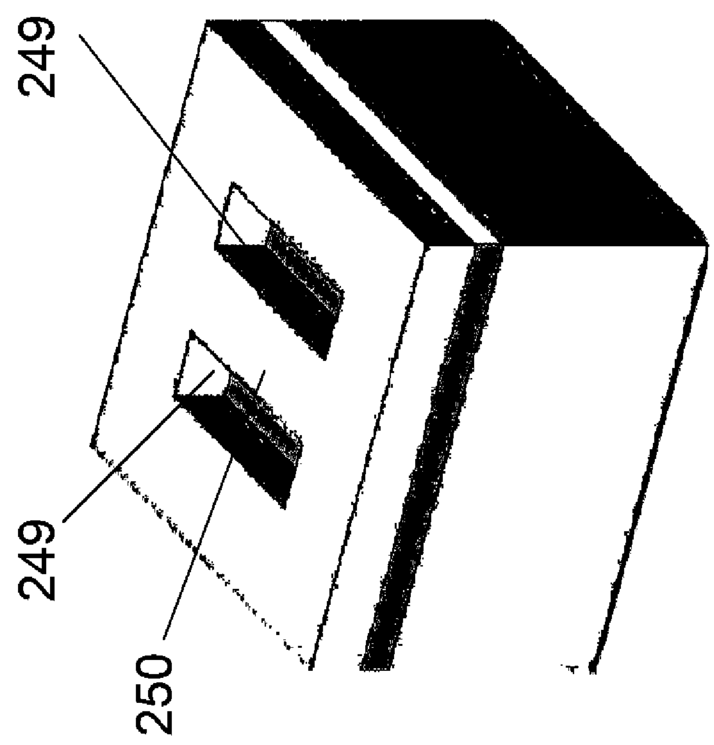

As shown in FIG. 2C, one or more recesses (e.g., two rectangles as shown) 249 are formed (e.g., etched) 204 into the device silicon layer. The etch terminates at the oxide layer. Note that this creates a center "bridge" feature 250. The oxide below the bridge 250 is then removed 206, to free the bridge and suspend it over the handle silicon layer as shown in FIG. 2D. In the example shown, only one, relatively large, bridge 250 is shown, although many such bridges 250, of relatively small dimensions may be provided within a single wafer 248 to provide increased manufacturing efficiencies due to increased device density, etc. These bridges 250 are intended to serve as the rigid links (e.g., coupler 120 and/or ground 130) within the finished mechanism. It should be noted that in many applications, these bridges may have dimensions (both length and width) of less than 1 μm and therefore many steps in their fabrication, such as the cutting discussed hereinbelow, may be effected using precision techniques such as e-beam lithography. Generally larger features, such as the recesses 249, may be readily fabricated using conventional optical lithography techniques such as the aforementioned etching. The invention, however, is not limited by the particular micro- or nano-fabrication techniques used for the various fabrication steps.

Figure 2E:
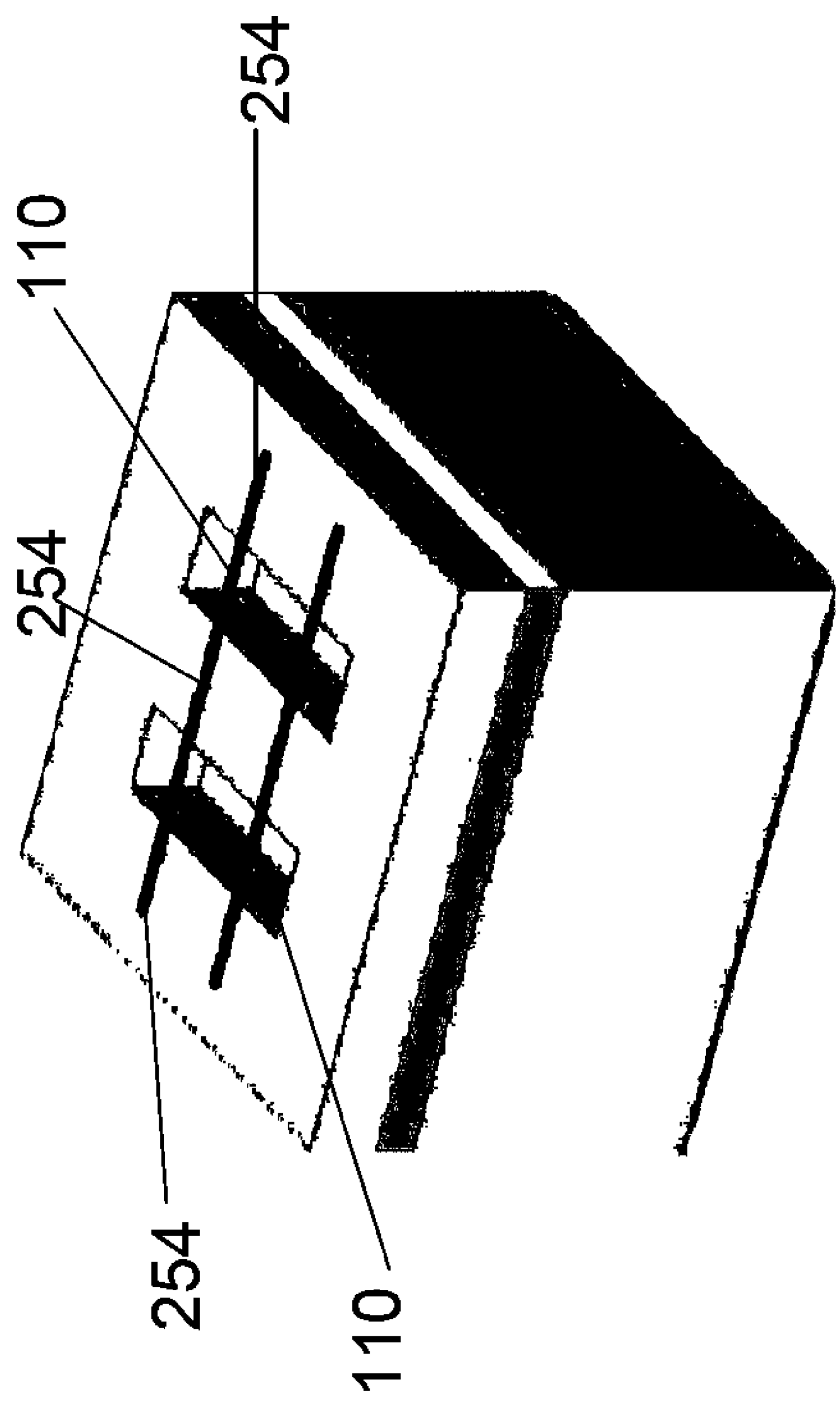

Referring now to FIG. 2E, SW or MW CNTs 110 are placed 208 across the suspended bridge 250 and gaps 249. The CNTs may be conveniently placed with a probe tip (pick and place method), via self-assembly processes, or grown in place using CVD processes (in which additional fabrication steps would typically be used to deposit a catalyst layer).

As an example of a suitable pick and place method, CNTs are known to adhere to a sharp tip, such as the sharpened tip of tungsten wire, via van der Waals interactions. Sharpened tungsten tips may be fabricated, for example, by electrochemical etching of a tungsten wire in a 2.0N NaOH solution. The DC voltage is controlled by an electrical circuit that detects a sudden change in the etch current when the submerged portion of the wire drops. The resulting tips tend to have radii in the rage from about 15 to about 50 nm. CNTs may be attached to the tungsten tip with or without the use of an adhesive. One technique that does not require an adhesive is as follows: First, the tungsten tip is aligned with a single CNT that protrudes from a film of CNTs using a nano-positioning stage that operates under an optical microscope. Second, the CNT is cut (oxidized) by passing electrical current through the CNT. Using such a tip and an attached CNT, the CNT may be deployed at a predetermined position on the silicon layer across bridge 250 and gaps 249.

The CNTs may then be anchored 208 to the silicon device layer with a bond 254 at desired CNT-substrate anchor points. In the exemplary embodiment shown, each CNT gets three anchors: one at each end (anchors the CNT to the device layer) and one to the suspended bridge 250. The bonds 254 may be formed by various means, including a weld form by conventional deposition of a film such as amorphous carbon (e.g., via e-beam (electron-beam) or focused ion beam (FIB)), metallic films by e-beam deposition (gold, silver, aluminum, etc), metallic films by chemical vapor deposition (CVD), polymer films such as SU-8 and other photoresists, chemical bonding to the surface via surface treatment (such as commonly used in nanoelectronics applications), and/or combinations thereof.

Figure 2F:
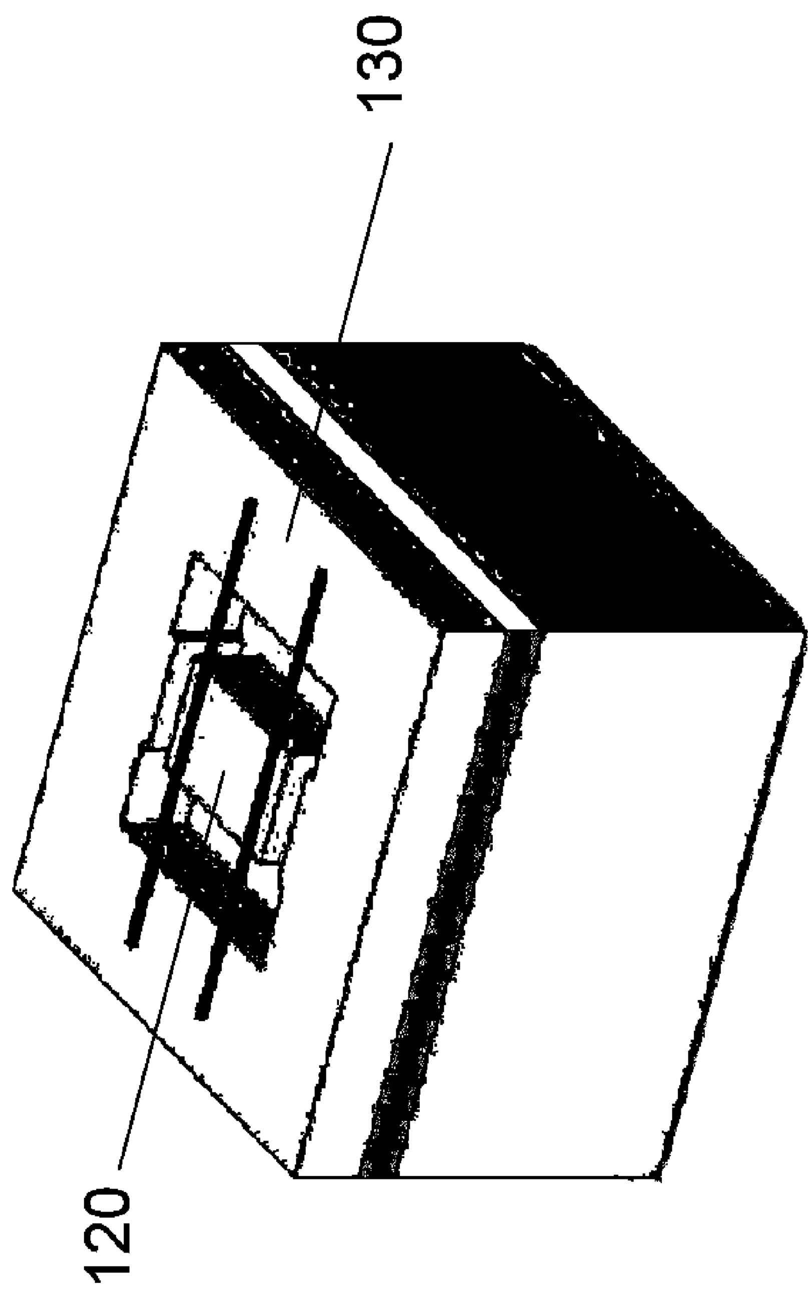

As shown in FIG. 2F, each end of bridge 250 is cut 210, e.g., using a focused ion beam (FIB) to form a coupler 120, etc., suspended from ground 130 by the two CNTs. The device silicon layer may then be removed 212 from the handle layer, and/or further cut as desired for particular applications. The size and shape of the rigid links (i.e., coupler 120, etc.) may be selected so that the mass of the rigid links and the length/diameter of the CNTs prevent forces (primarily gravitational and electrostatic) from causing out of plane distortion of the finished compliant mechanism, while providing relatively high resonance frequencies for high bandwidth operation.

Figure 3A:
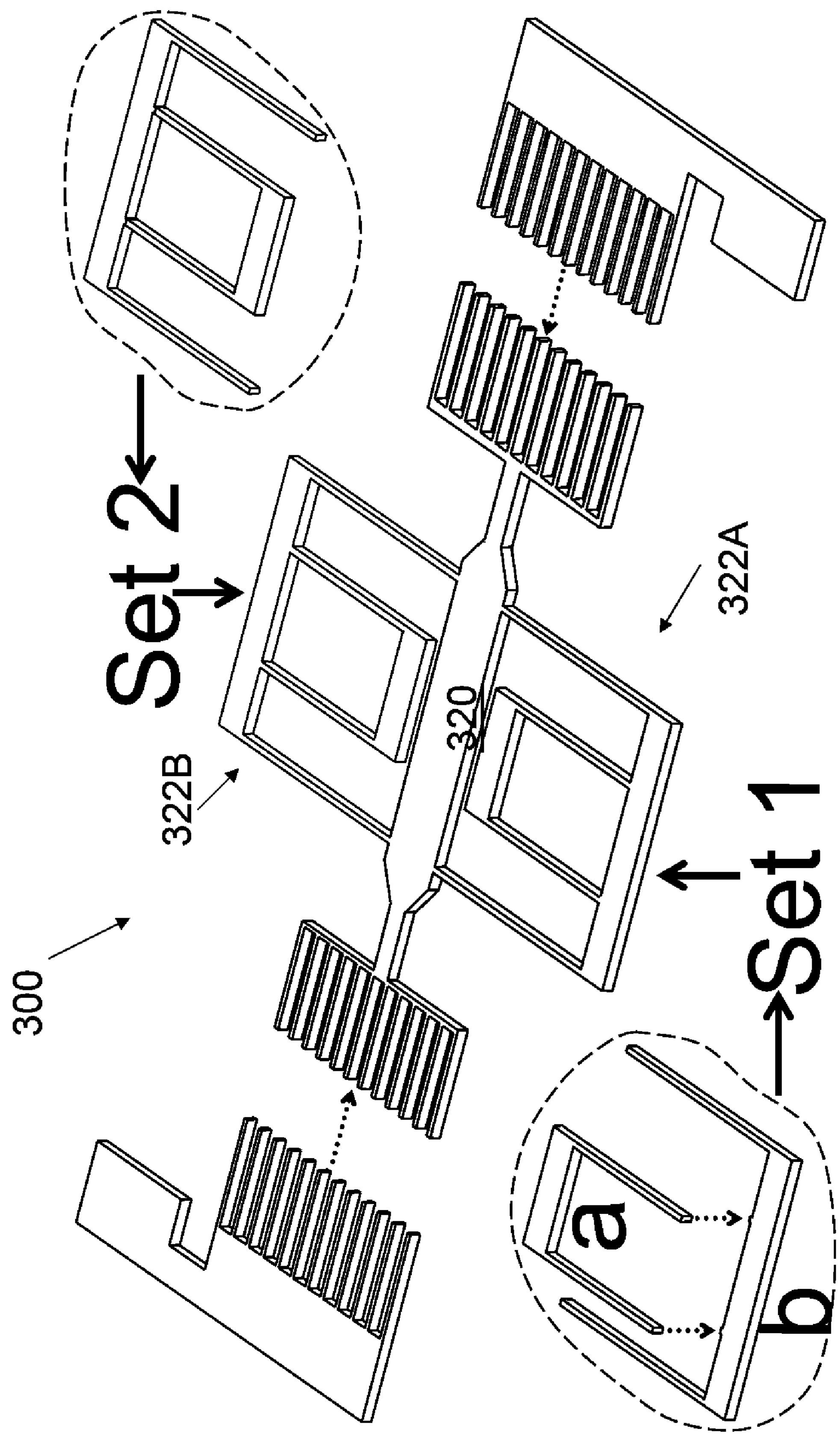
FIG. 3A is a perspective, partially exploded view of an exemplary nano-scale machine which includes one or more of the compliant mechanisms of FIG. 1A.
Figure 3B:
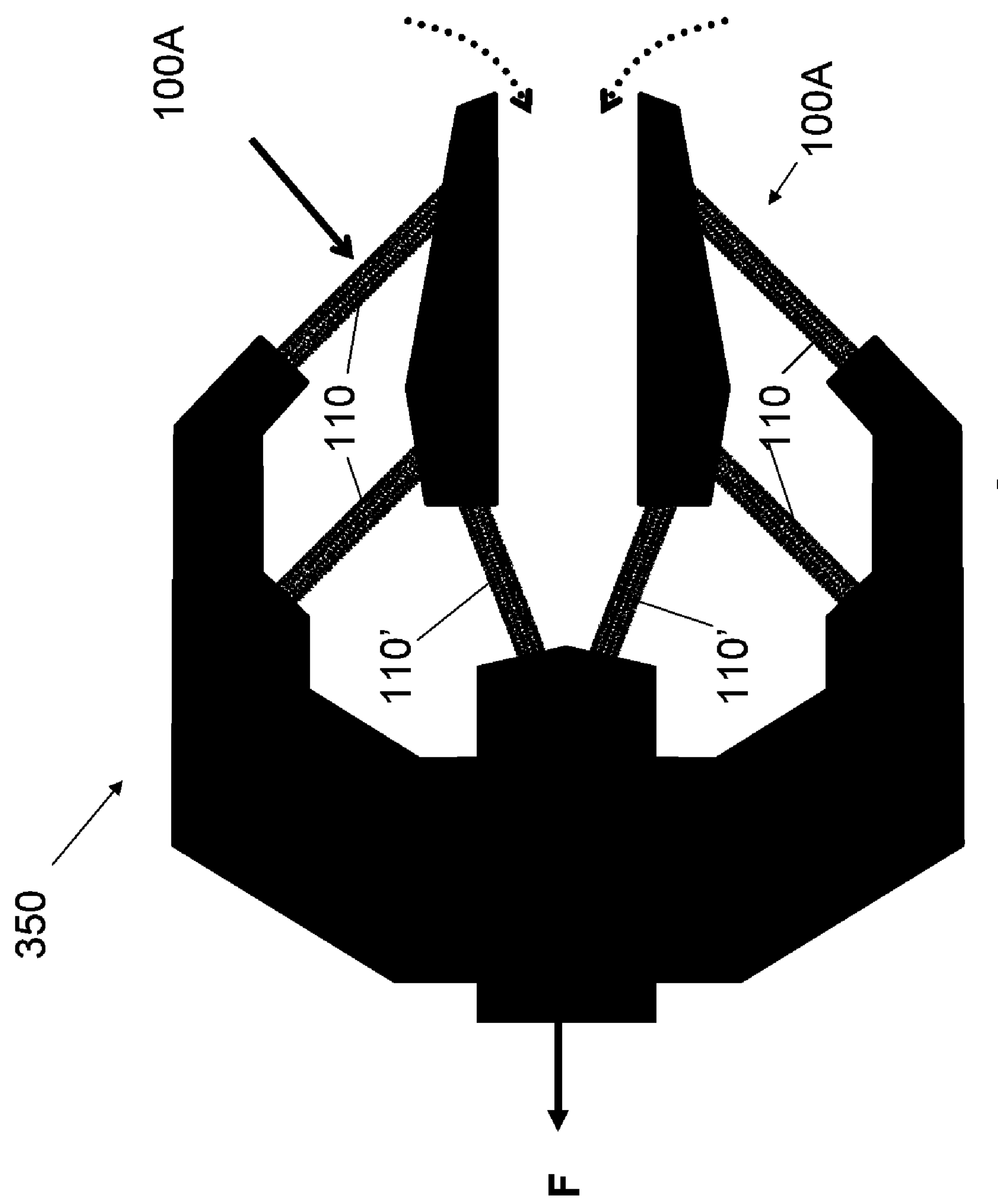
FIG. 3B is a schematic plan view of another exemplary nano-scale machine, which includes one or more of the compliant mechanisms of FIG. 1A.

Turning now to FIGS. 3A and 3B, nano-scale CM elements in accordance with this invention (e.g., nanoCM 100A) may be advantageously utilized to make complex nano-mechanical devices (also referred to as nano-machines). FIG. 3A depicts one exemplary embodiment of such a machine, in the form of a linear bearing 300 that uses multiple CM elements (e.g., elements 100A of FIG. 1A in this example) combined in series and parallel to guide the motion of a central shuttle 320 in a single linear dimension. As shown, linear bearing 300 includes series combinations of "a" and "b" of CM elements 100A (FIG. 1A) to create the first and second sets 322A and 322B that are combined in parallel to guided shuttle 310 along a linear path. In this embodiment, CNTs 110 of each CM element "a" are fastened to CM element "b" as shown, to effectively join them in series. In this series arrangement, only element "a" is fastened to ground, so that movement of shuttle 310 is guided by bending of the CNTs of both elements "a" and "b" of a particular set. Two or more sets 322A, 322B may be similarly coupled to shuttle 320 to provide effectively operate in parallel with one another. FIG. 3B depicts another exemplary embodiment in which a nano-mechanical gripper 350 includes opposing CM elements 100A (FIG. 1A). Application of force F generates tension in CNTs 110', which bends CNTs 110 to move jaws formed by couplers 120 in the direction shown by phantom arrows to close the gripper. Upon removal of the force, the nanotubes straighten and the gripper is opened.

Mechanical Behavior of Nano-Scale CMs

Figure 4:
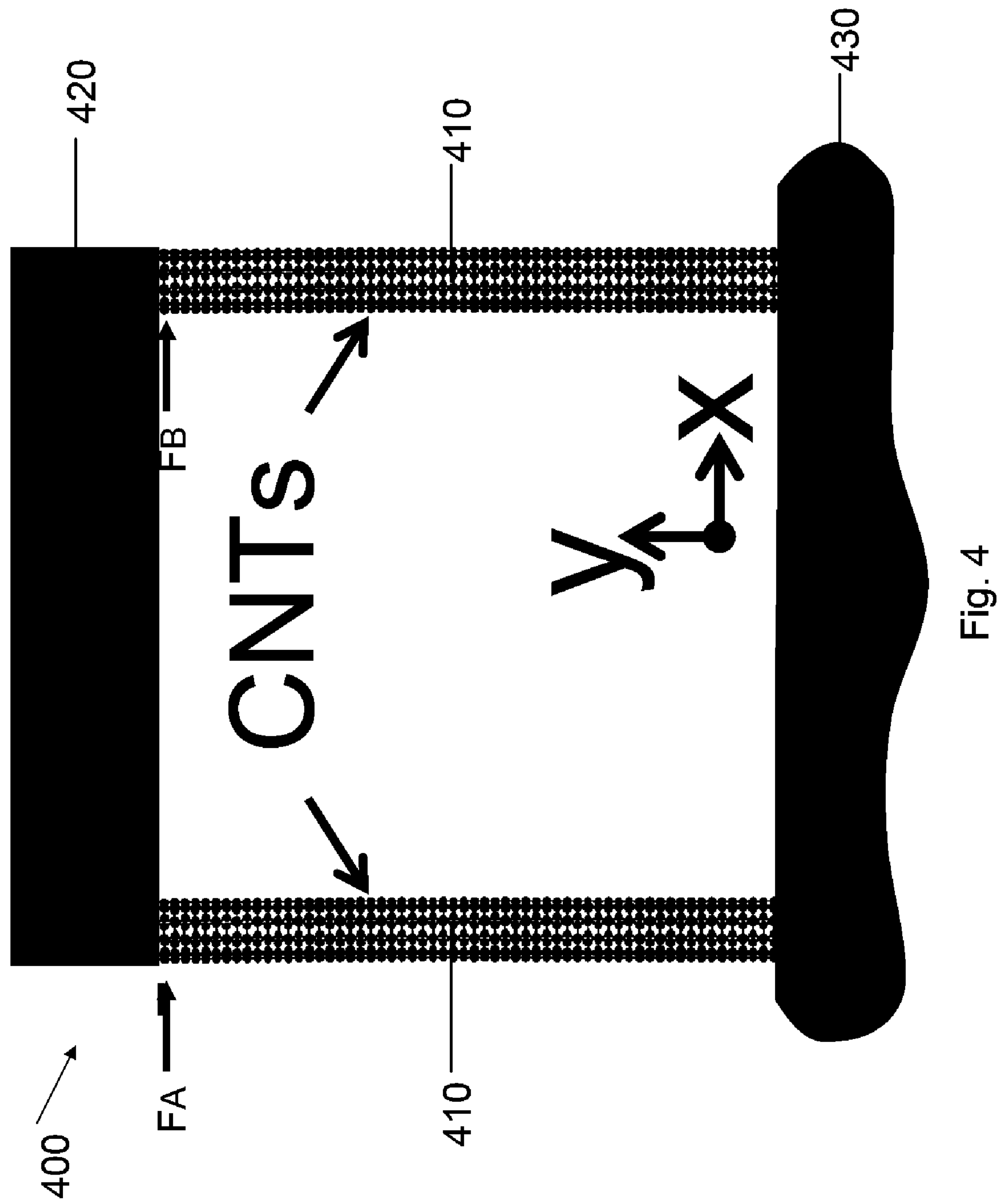
FIG. 4 is a schematic representation of an exemplary nano-scale parallel four-bar compliant mechanism in accordance with the invention.

Turning now to FIG. 4, theoretical molecular simulations were utilized to model the performance of nanoCMs in accordance with the present invention. The theoretical nanoCM 400 is similar to nanoCM 100A (FIG. 1A) in that it includes a PGM having first and second, parallel SWCNTs 410 deployed between and rigidly connected to a structural ground 430 and a coupler 420. The structural ground 430 and the coupler 420 are assumed to possess a high stiffness that warrants modeling them as theoretically rigid relative to the SWCNTs. Two forces, $F_A$ and $F_B$, having equal magnitude, were applied mathematically to the coupler 420. The nanotubes 410 were further assumed to be defect-free. The invention is, of course, not limited to such model assumptions. As shown in FIG. 4 and in Table 1, nanoCM has a mechanism (device) size (e.g., along either x or y axes) of less than about 100 nm. Characteristics of the SWCNTs used in the molecular simulations are shown in Table 1:

TABLE 1

| | |
|---|---|
| Length (L) | 76.4 Å |
| Nominal Diameter (D) | 6.7 Å |
| Carbon Atoms per Tube | 640 atoms |
| Chirality | (5, 5) |

Figures 5A, 5B, 5C:
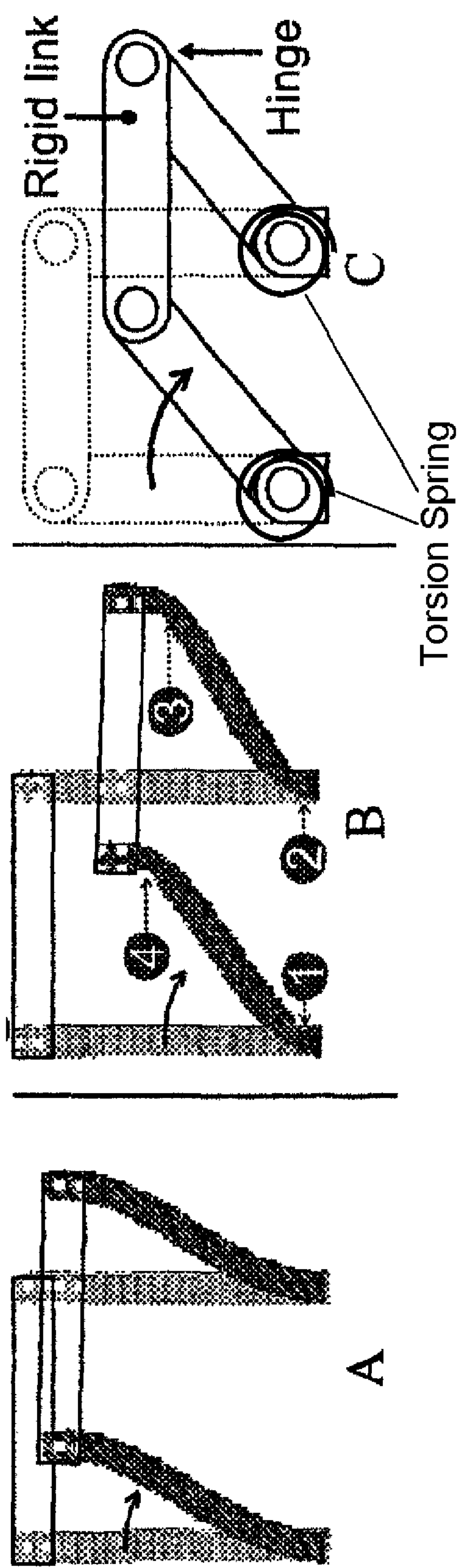
FIGS. 5A and 5B are schematic representations of the nano-scale compliant mechanism of FIG. 4, moving into region 1 (non-buckled) and region 2 (buckled).
FIG. 5C is a view similar to those of FIGS. 5A and 5B, of a conventional rigid link-hinge parallel-guided mechanism for comparison purposes.

The above described molecular simulations revealed two regions of mechanical operation. These regions of operation are illustrated in FIGS. 5A and 5B. In the first region (Region 1, FIG. 5A), displacement of the device is governed by bulk elastic deformation of the SWCNTs. This region 1 behavior is similar to that experienced in large-scale (macro- and micro-scale) compliant PGMs. The motion in this region tends to be well defined and stable. At a critical load, kinks form at the ends of the carbon nanotubes as shown in FIG. 5B (kinks 1, 2, 3, and 4 are shown). The kinks form when it becomes energetically favorable for the CNTs to form kinks in order to minimize the potential energy of the nano-PGM system. This region 2 (FIG. 5B) mechanical behavior occurs when each tube end has kinked, i.e., when there are four kinks (one at each end of each CNT). When at least one, but less than all of the ends have kinks, e.g., in the embodiment shown, the number of kinks is not zero (region 1) or four (region 2), the device is in a transition region. In region 2, the device's displacements are governed by the compliant, hinge-like bending of the four kinks. The device geometry in region 2 resembles that of a rigid link-hinge PGM having a torsion spring deployed at each hinge (e.g., as shown on the conventional macro-scale device in FIG. 5C). The present inventors have found that the similarity between region 2 mechanical behavior and link-hinge PGM may enable the wealth of knowledge regarding the design of rigid link-hinge PGMs to be adapted to predict the behavior of the inventive nanoCMs in region 2.

Figures 6A, 6B:
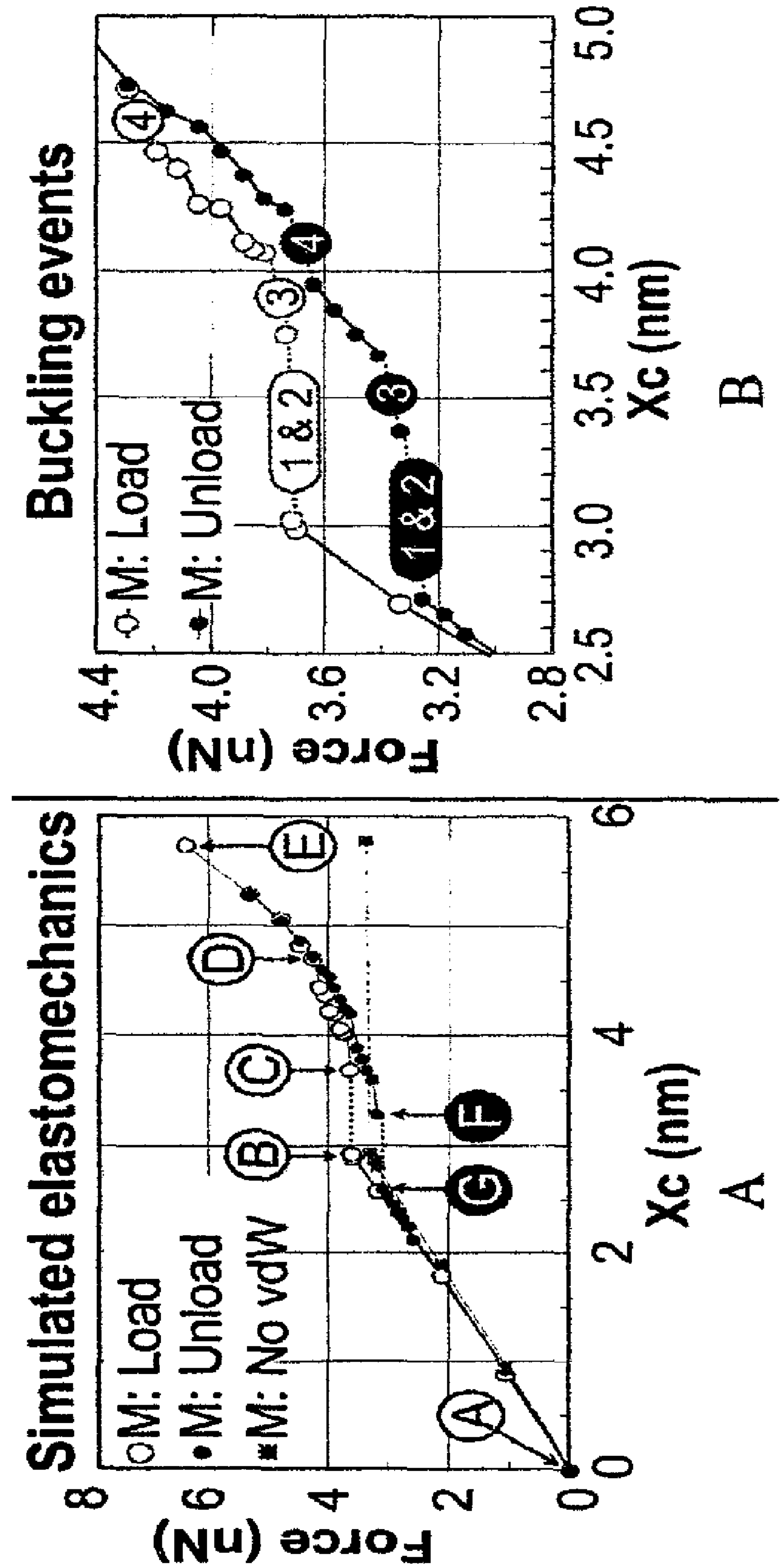
FIGS. 6A and 6B are graphical representations of elasto-mechanical response (6A) and buckling events (6B) of the nano-scale compliant mechanism of FIG. 4.

With reference now to FIGS. 6A and 6B, the buckling events that lead to the kinks are described in more detail. FIGS. 6A and 6B plot simulated force (in nN) versus distance (in nm) for both loading and unloading of the nano-scale PGM of FIG. 4. FIG. 6B plots identical data to that of FIG. 6A but highlights the range over which the loading and unloading curves are not coincident. On loading (open circles in FIGS. 6A and 6B), the coupler 420 travels via points A-B-C-D-E, and then through points E-D-F-G-A on unloading. While not wishing to be bound by theory, the difference between the loading and unloading curves is thought to be the result of two phenomena: (i) van der Waals interactions and (ii) the geometric nonlinearity associated with the buckled geometry. The invention is, of course, not limited in this regard.

Again, not wishing to be bound by any particular theory, the shape of the loading curve is considered first. In considering a longitudinal cross-section of a non-buckled nanotube 410, there are weakly attractive forces between carbon atoms at the 12 and 6 o'clock positions while there is a strong repulsive reaction between carbon atoms at the 2 o'clock and 4 o'clock positions. The sum of the repulsive forces across the diameter tends to be larger than the attractive forces in the same direction. The repulsion acts to hold the walls of a (5,5) nanotube during loading. As van der Waals interactions prevent the collapse of smaller tubes, and in some cases will aid the collapse of larger tubes, the elasto-mechanic response of a carbon nanotube-based nanoCMs in accordance with the invention tends to be diameter specific. The effect on a (5,5) nano-scale PGM may be observed in FIG. 6A by comparing the normal loading curve (M:Loading) with the loading curve obtained when van der Waals interactions are disabled (M:no vdW). The van der Waals interactions lead to higher device stiffness (slope) in region one and a higher critical buckling load at which the tube ends lose bending stiffness. Immediately following buckling, the new device topology may be defined by (a) the reduced moment stiffness of the kinked cross-sections near the tube ends, (b) the comparatively larger stiffness of the yet-to-buckle tube ends, and (c) the repulsive van der Waals interactions within the buckled and non-buckled tube ends. While one or more tube ends are not buckled, the loading curve tends to be higher than the unloading curve due to the higher force required to deform unbuckled tubes.

Figure 7:
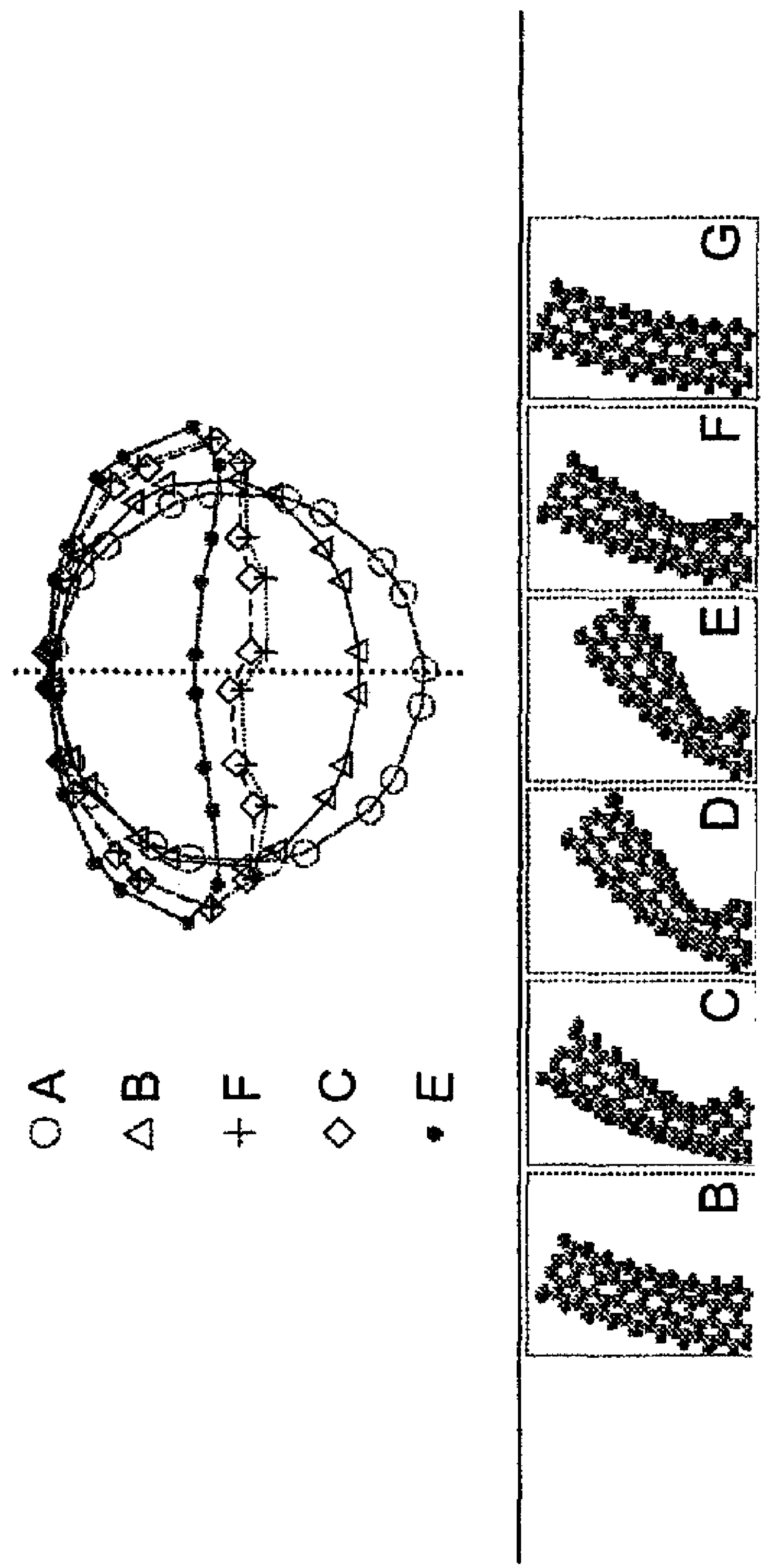
FIGS. 7A-7G are schematic axial (7A) and lateral (7B-7G) cross-sectional diagrammatic views of kink 2 of FIG. 5B at different mechanical loads.

The shape of the unloading curve is now considered in more detail. At and beyond point D, all of the tube ends have buckled and the loading and unloading curves coincide. When the load is reduced below that of point D, it tends to not be energetically preferential for the kinks to immediately revert back to their pre-buckled circular cross-sections. FIG. 7 shows the difference between the buckled and non-buckled cross-sections at various states of loading.

The combination of the tube end geometries and the lower bending stiffness of the buckled cross-sections cause the unloading curve to follow a path that differs from the loading curve (commonly referred to as hysteresis). While not wishing to be tied to a particular theory, it is suspected that van der Waals interactions are responsible for this direction dependent elasto-mechanic behavior in the axially buckled carbon nanotubes.

As unloading continues, the kinks reach states where it becomes energetically preferential to revert back to a pre-buckled cross-section. In doing so, the potential energy stored within the kinks' bonds and the energy stored via van der Waals interactions, is released into the structure of the tube. This helps to explain why the areas below the loading and unloading curves (FIG. 6A) tends to be equivalent.

Figure 8:
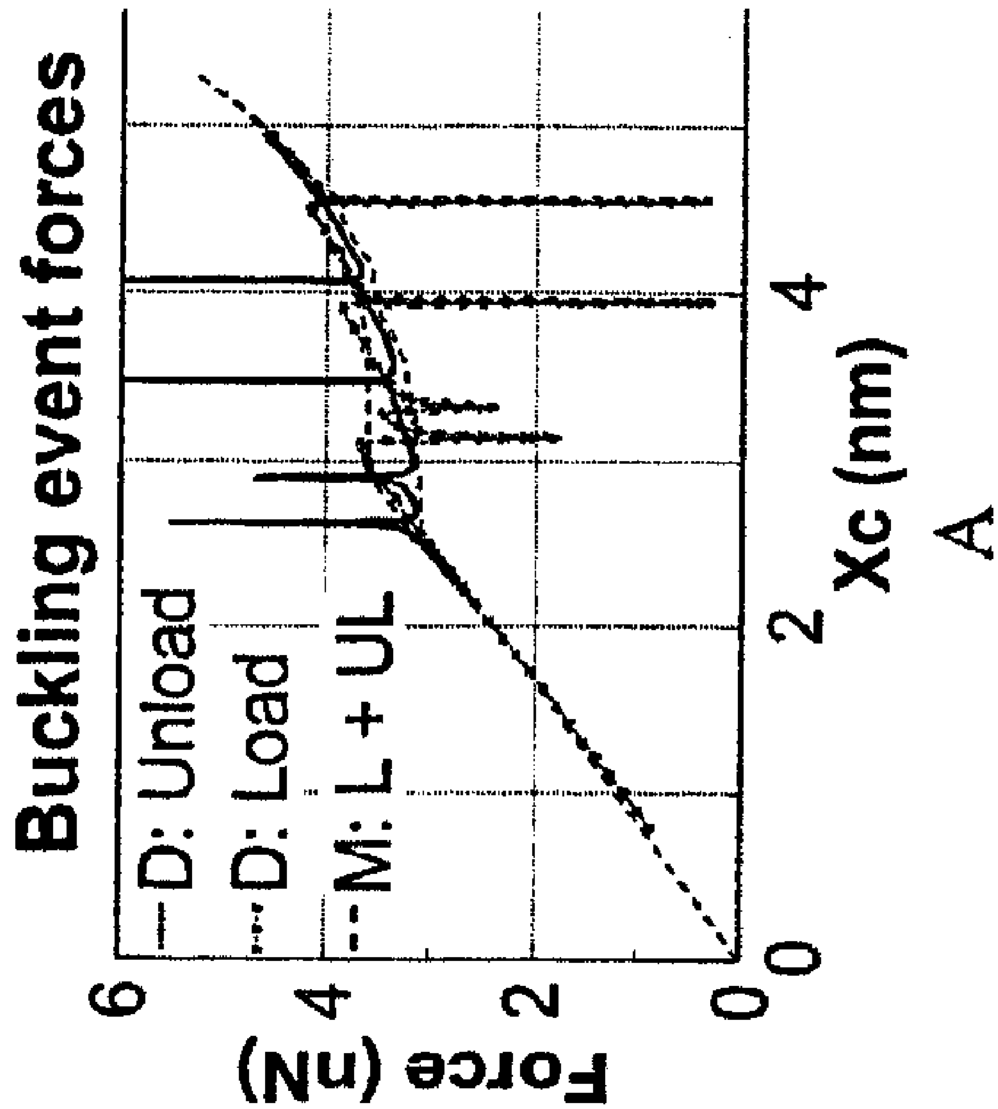
FIG. 8 is a graphical representation of theoretical elasto-mechanical behavior during buckling and unbuckling of the nanotubes.

FIG. 8 shows the results of molecular mechanics simulations (M:L+UL) superimposed upon molecular dynamics simulations during loading (D:Load) and unloading (D:Unload). The molecular dynamics simulations enable the behavior of the mechanism during the buckling events to be captured. On loading, the force required to maintain a position $x_C$ decreases when a kink is formed. On unloading, the force required to hold a position increases when a buckled cross-section reverts to a pre-buckled shape. The decreasing and increasing forces may be seen in FIG. 8 as "dips" and "spikes". The net result tends to be an equal area beneath the loading and unloading curves when the simulation is run without energy losses within the mechanism. Thus the simulated theoretical work done on the mechanism during loading, and the work done by the mechanism during unloading tends to be equal. Applicants' simulations show that the "Load" and "Unload" areas differ by less than 1% which is within the error of the simulations.

Figures 9A, 9B:
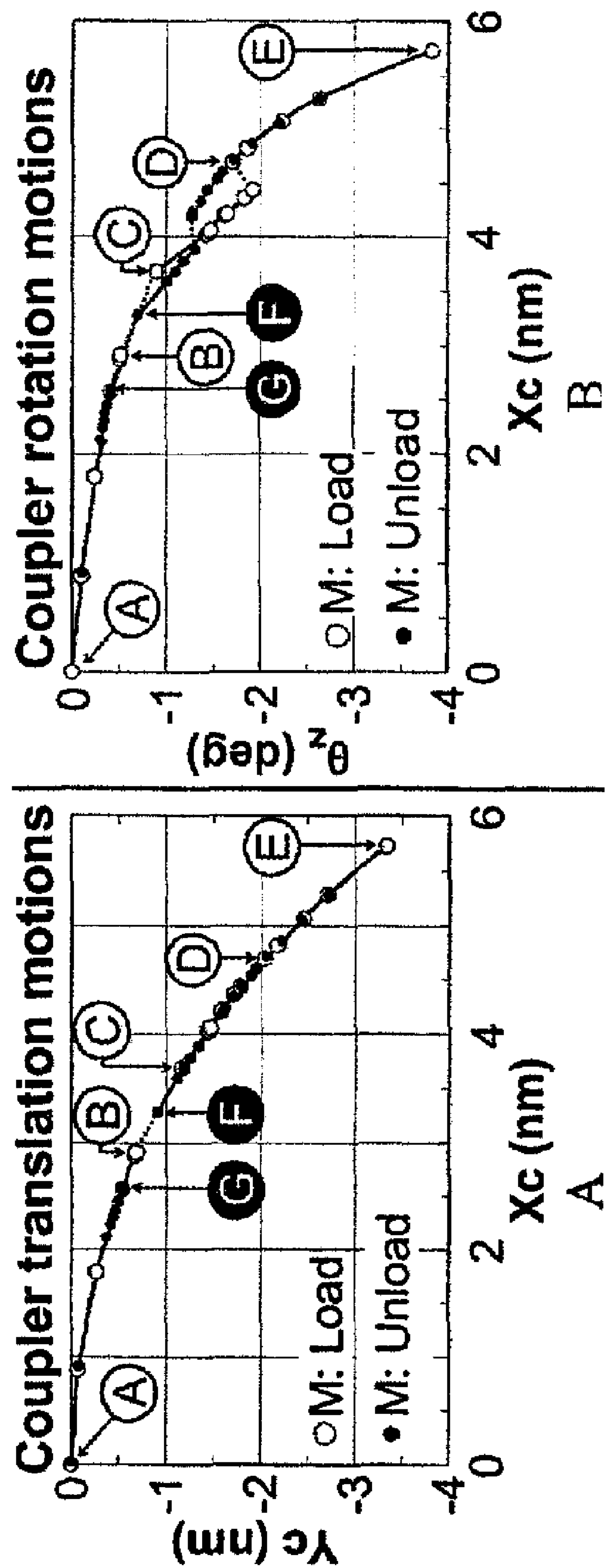
FIGS. 9A and 9B are graphical representations of simulated translation displacements (A) and rotation displacements (B) of the coupler during loading and unloading of the compliant mechanism depicted on FIG. 4.

Translational and rotational displacements of the nanoCM depicted on FIG. 4 have also been modeled. The displacements of the coupler 420, $x_C$-$y_C$-$\theta_z$, were calculated for a location at the center of coupler 420 and are shown in FIGS. 9A and 9B. FIG. 9A depicts translational motion of the coupler 420 during loading and unloading in a plot of displacement along the y axis versus displacement along the x-axis (the x and y axes are defined on FIG. 4). As shown, displacement of coupler 420 is substantially linear at small displacements (less than 1 nm). As the amount of x-axis displacement increases, y-axis displacements also increase. FIG. 9B depicts coupler rotational motion (rotation about the out-of-plane (z) axis). The small rotation of the coupler 420 (less than 4 degrees) is consistent with macro-scale behavior. The discontinuities and the coupler rotation are correlated with the nanotube buckling events. The small magnitudes of the discontinuities in rotation (fractions of a degree) do not induce significant changes in the $x_C$ (less than 0.3 pm) or $y_C$ (less than 17 pm) position of the coupler 420. FIG. 9A therefore has the appearance of continuous, reversible operation.

With continued reference to FIG. 9A, the exemplary embodiment shown is advantageously capable of repeatedly (reversibly) achieving deflections that are greater than 50% of the device size. As shown, the exemplary nanoCM depicted on FIG. 4 may be subject to an x-axis deflection of nearly 6 nm, which is approximately 75% of the x- and y-axis dimensions of the device (of approximately 8 nm, using carbon nanotubes of 7.6 nm in length in the exemplary embodiment shown). The y-axis deflection of the coupler is approximately 3.5 nm, which is approximately 45% of the device size. While the invention is not limited in these regards, nanoCMs that are capable of achieving reversible deflections that are greater than 50% of the device size will be understood to be potentially advantageous for the fabrication of complex nano-mechanical systems.

With further reference to FIG. 9A, it will be understood that non-reversible bond reconfiguration i.e., plastic deformation, over the above described range of operation is not expected. In the example shown, the smallest radius of curvature in the kinks is at 0.76 nm or above; thus, no irreversible sp2 or sp3 bond changes should occur. The maximum strained bond length in any simulation is 1.6 Å, which is less than the bond failure (plastic deformation) length, which is generally believed to be between 1.7-1.9 Å.

It will be appreciated that the present invention is not limited to the use of SWCNT. MWCNT may also be utilized as described above. Nor is the invention even limited to carbon nanotubes. Inorganic nanotubes, which tend to be morphologically similar to carbon nanotubes, may likewise be utilized. For example, inorganic nanotubes have been synthesized from boron nitride, silicon, titanium dioxide, tungsten disulfide, and molybdenum disulfide. Such inorganic nanotubes may be suitable for certain exemplary embodiments in accordance with the invention.

Although the present invention and its advantages have been described in detail, it should be understood that various changes, substitutions and alternations can be made herein without departing from the spirit and scope of the invention as defined by the appended claims.

We claim:

1. A nano-scale compliant mechanism comprising:

a grounded component;

a mechanical coupler disposed to move relative to the grounded component; and a plurality of nanotubes having first and second ends, the first ends of the nanotubes being coupled to the grounded component and the second ends of the nanotubes being coupled to the coupler, the nanotubes being compliant relative to the grounded component and the coupler;

wherein the coupler is disposed for substantially linear motion relative to the grounded component.

2. The compliant mechanism of claim 1, wherein the coupler is disposed for arcuate motion relative to the grounded component.

3. The compliant mechanism of claim 1, wherein at least one of the nanotubes comprises a carbon nanotube.

4. The compliant mechanism of claim 1, wherein at least one of the nanotubes is selected from the group consisting of single-walled carbon nanotubes and multi-walled carbon nanotubes.

5. The compliant mechanism of claim 1 further comprising a bond deployed at the first and second ends of the nanotubes, the bond rigidly coupling the first ends of the nanotubes to the ground component and the second ends of the nanotubes to the coupler.

6. The compliant mechanism of claim 5, wherein the bond is selected from the group consisting of an amorphous carbon film, a metallic film, a polymeric film, a photoresist, a chemical bond, and/or combinations thereof.

7. A nano-scale compliant mechanism comprising:

a grounded component;

a mechanical coupler disposed to move relative to the grounded component; and a plurality of nanotubes having first and second ends, the first ends of the nanotubes being coupled to the grounded component and the second ends of the nanotubes being coupled to the coupler, the nanotubes being compliant relative to the grounded component and the coupler;

wherein displacement of the coupler relative to the grounded component induces a bending strain in the nanotubes.

8. The compliant mechanism of claim 7, wherein the coupler is disposed for rotary motion relative to the grounded component.

9. The compliant mechanism of claim 7, wherein at least one of the nanotubes is configured to accommodate bending strains of up to at least 40%.

10. The compliant mechanism of claim 7, wherein said displacement of the coupler exhibits first and second regions of mechanical behavior:

a first region in which the bending strain is relatively low, the first region being governed by bulk elastic deformation of the nanotubes; and a second region in which said bending strain is relatively high, the second region being governed by compliant, hinge-like bending of at least one kink in the nanotubes.

11. The compliant mechanism of claim 7, wherein said displacement of the coupler exhibits a divergence of the loading and unloading path upon cyclic loading and unloading of the mechanical coupler.

12. The compliant mechanism of claim 7 being configured to achieve coupler displacements of at least 50% of a length of the nanotubes.

13. A nano-scale parallel-guided mechanism comprising:

a grounded component;

a mechanical coupler; and a plurality of carbon nanotubes each having first and second ends and a longitudinal axis, the longitudinal axes of the nanotubes being substantially parallel with one another, the first end of each of the nanotubes being coupled to the grounded component, the second end of each of the nanotubes being coupled to the coupler, the nanotubes being compliant relative to the grounded component and the coupler.

14. The parallel-guided mechanism of claim 13, wherein each of the nanotubes comprise a single-walled carbon nanotube.

15. The parallel-guided mechanism of claim 13, wherein at least one of the nanotubes is configured to accommodate bending strains of up to at least 40%.

16. The compliant mechanism of claim 13 being configured to achieve coupler displacements of at least 50% of a length of the nanotubes.

17. The parallel-guided mechanism of claim 13, wherein the coupler is disposed to displace relative to the grounded component in response to a force directed substantially orthogonally to the longitudinal axes of the nanotubes, said displacement inducing a bending strain in each of the nanotubes.

18. The parallel-guided mechanism of claim 17, wherein said displacement of the coupler exhibits first and second regions of mechanical behavior:

a first region in which said induced bending strain is relatively low, the first region being governed by bulk elastic deformation of the nanotubes; and a second region in which said bending strain is relatively high, the second region being governed by compliant, hinge-like bending of first and second kinks in each of the nanotubes.

19. The parallel-guided mechanism of claim 17, wherein said displacement of the mechanical coupler exhibits a divergence of the loading and unloading path upon cyclic loading and unloading of the coupler.

20. The parallel-guided mechanism of claim 14, further comprising a bond deployed at the first and second ends of each of the nanotubes, the bond rigidly coupling the nanotubes to the grounded component and the coupler.

21. The compliant mechanism of claim 20, wherein the bond is selected from the group consisting of an amorphous carbon film, a metallic film, a polymeric film, a photoresist, a chemical bond, and/or combinations thereof.

22. A nano-scale compliant mechanism comprising:

a grounded component;

a mechanical coupler disposed to move relative to the grounded component; and a plurality of nanotubes having first and second ends, the first ends being coupled to the grounded component and the second ends being coupled to the coupler;

wherein displacement of the coupler relative to the grounded component induces a bending strain in the nanotubes, said displacement exhibiting first and second regions of mechanical behavior:

the first region including relatively low bending strain; and the second region including relatively high bending strain, the second region being predominantly governed by compliant, hinge-like bending of at least one kink in the nanotubes.

23. The compliant mechanism of claim 22, wherein the nanotubes comprise a carbon nanotube selected from the group consisting of single-walled carbon nanotubes and multi-walled carbon nanotubes.

24. The compliant mechanism of claim 22, wherein the nanotubes are configured to accommodate bending strains of up to at least 40%.

25. The compliant mechanism of claim 22 being configured to achieve coupler displacements of at least 50% of a length of the nanotubes.

26. The compliant mechanism of claim 22, wherein said displacement of the coupler exhibits a divergence of the loading and unloading path upon cyclic loading and unloading of the mechanical coupler.

27. The compliant mechanism of claim 22, further comprising a bond deployed at the first and second ends of the nanotubes, the bond coupling of the nanotubes to the grounded component and the coupler.

28. The compliant mechanism of claim 27, wherein the bond is selected from the group consisting of an amorphous carbon film, a metallic film, a polymeric film, a photoresist, a chemical bond, and/or combinations thereof.

* * * * *